United States Patent [19]

Bydder

[11] Patent Number: 4,774,468

[45] Date of Patent: Sep. 27, 1988

[54] COIL ARRANGEMENTS FOR NUCLEAR MAGNETIC RESONANCE APPARATUS

[75] Inventor: Graeme M. Bydder, London, England

[73] Assignee: Picker International Limited, Middlesex, England

[21] Appl. No.: 32,992

[22] Filed: Mar. 27, 1987

Related U.S. Application Data

[63] Continuation of Ser. No. 665,759, Oct. 29, 1984, abandoned.

[30] Foreign Application Priority Data

Nov. 2, 1983 [GB] United Kingdom ............... 8329196

[51] Int. Cl.⁴ ............................................ G01R 33/20
[52] U.S. Cl. ................................... 324/318; 128/653
[58] Field of Search ............. 324/300, 307, 309, 318, 324/320, 322, 319; 128/379, 380, 653

[56] References Cited

U.S. PATENT DOCUMENTS

| | | | |
|---|---|---|---|
| 796,533 | 8/1905 | Rayner | 128/379 |
| 2,718,584 | 9/1955 | Hariu | 128/380 |
| 3,515,979 | 6/1970 | Golay | 336/230 |
| 4,398,148 | 8/1983 | Barjhoux et al. | 324/307 |
| 4,398,149 | 8/1983 | Zens | 324/319 |
| 4,567,440 | 1/1986 | Haselgrove | 324/309 |
| 4,587,493 | 5/1986 | Jepponen | 324/318 |

FOREIGN PATENT DOCUMENTS

| | | | |
|---|---|---|---|
| 0011335 | 11/1979 | European Pat. Off. | |
| 0047065 | 3/1982 | European Pat. Off. | 324/307 |
| 2039055A | 7/1980 | United Kingdom . | |
| 2091884A | 1/1981 | United Kingdom . | |
| 2056086 | 3/1981 | United Kingdom . | |
| 2056078 | 3/1981 | United Kingdom . | |
| 2082775A | 3/1982 | United Kingdom . | |
| 2137757A | 3/1984 | United Kingdom . | |
| 2137756A | 3/1984 | United Kingdom . | |

OTHER PUBLICATIONS

McKee et al., A Simple Technique for Encapsulating NMR coils in Teflon PTFE, 5/6/76, J. of Physics E: Scientific Instruments 1976 vol. 9.

*Primary Examiner*—Stewart J. Levy
*Assistant Examiner*—Kevin D. O'Shea
*Attorney, Agent, or Firm*—Watts, Hoffmann, Fisher & Heinke

[57] ABSTRACT

A radio frequency coil arrangement for an NMR imaging apparatus comprising one or more coils (10A, 10B) which are convexly shaped to facilitate close fitting of the arrangement round a body being imaged.

10 Claims, 2 Drawing Sheets

COIL ARRANGEMENTS FOR NUCLEAR MAGNETIC RESONANCE APPARATUS

This application is a continuation of application Ser. No. 665,759, filed Oct. 29, 1984, now abandoned.

This invention relates to coil arrangements for nuclear magnetic resonance (NMR) apparatus.

More particularly the invention relates to coil arrangements for NMR apparatus of the kind suitable for use in the medical examination of patients, for example, to provide an image representing the distribution in a selected region of a patient of a chosen quantity, e.g. the density of chosen nucleons, for example, hydrogen protons, or of NMR spin relaxation time constants.

Such apparatus operates by the application of a radio frequency (RF) magnetic excitation field in the presence of other magnetic fields and the sensing and analysis of the resulting nuclear magnetic resonance produced in the body. The RF fields are normally applied and the resulting signals sensed by different coils, although the same coils may be used for both functions.

In known forms of NMR imaging apparatus the RF coils are disposed so as to lie generally in a tubular surface. However, such an arrangement has the disadvantage that, at least for the examination of certain parts of the human body such as the head, the arrangement, when used for sensing, exhibits relatively low sensitivity to the NMR signals. Furthermore, when used for applying an RF field, such an arrangement often leaves something to be desired in respect of homogeneity of field and efficiency of generation.

It is an object of the present invention to provide an RF coil arrangement for an NMR apparatus of such a form as to alleviate this problem.

According to the present invention a coil arrangement for use in an NMR apparatus for the application of and/or sensing of RF fields during examination of a body by means of the apparatus comprises at least one coil at least part of which lies substantially in a convexly curved surface to facilitate close fitting of the arrangement round a body being examined.

In a preferred arrangement said surface is generally spherical.

In one particular embodiment of the invention suitable for use in the examination of the head of a patient, the coil arrangement comprises a coil former in the form of a helmet adapted to be disposed on the head of a patient and a pair of similar said coils supported one on either side of said former in substantially coaxial alignment and each comprising a plurality of turns lying one within the other.

Normally each said coil has a plurality of turns connected in series, in which case the turns of each coil are suitably arranged to form a coil of spiral form. The two coils may be connected in series or in parallel in use.

One coil arrangement in accordance with the invention and an NMR apparatus using the coil arrangement will now be described by way of example with reference to the accompanying drawings in which.

The apparatus is for the most part of conventional form, for example, as described in UK Patent Specification No. 1,578,910 or No. 2,056,078.

The basic elements of such an apparatus are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Figure 1:
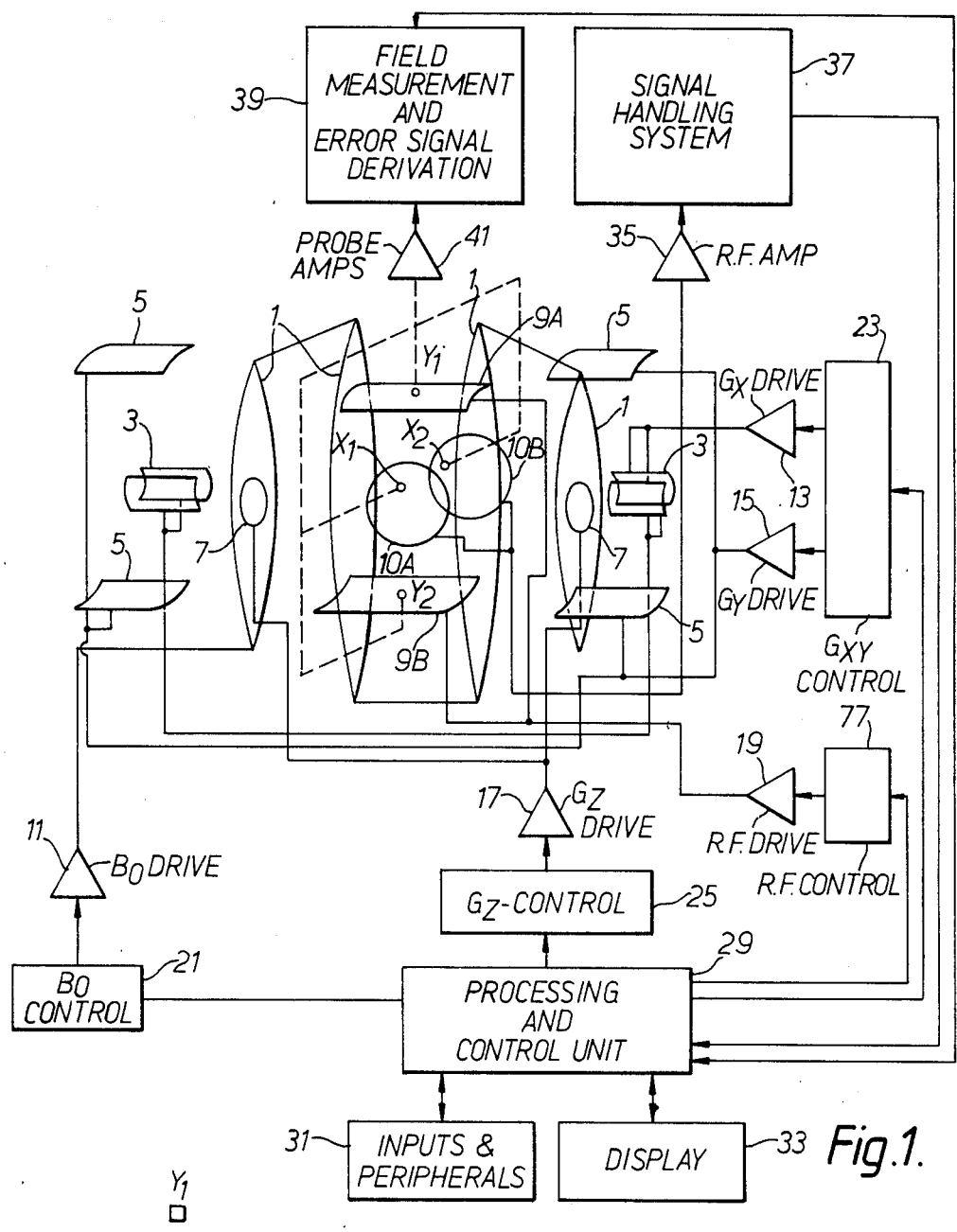
FIGS. 1 and 2 illustrate the apparatus diagrammatically.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second RF coil system whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

The second coil system comprises a first coil arrangement comprising a pair of coils 9A and 9B for applying RF fields, and a second coil arrangement comprising a pair of coils 10A and 10B for detecting RF fields, the position of the coils only, and not their configuration, being indicated in FIG. 1.

The various coils, 1, 3, 5, 7, 9A and 9B are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 10A and 10B are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

Figure 2:
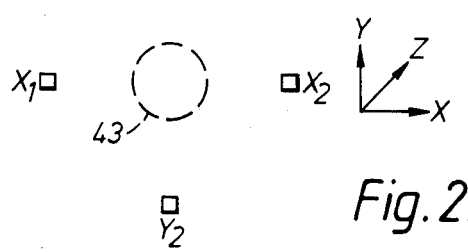

The apparatus also includes field measurement and error signal circuits 39 which receive signals via amplifiers 41 from field probes $X_1$, $X_2$, $Y_1$ and $Y_2$ which are disposed at suitable positions in relation to a slice 43 of the body being examined, as illustrated in FIG. 2, to monitor the applied magnetic fields.

The apparatus may be used in known manner for producing images representing the distribution of proton density or NMR spin relaxation time constants in a selected region of the body under examination. However, a knowledge of such techniques is not essential to an understanding of the present invention, and will therefore not be further described herein.

In conventional NMR imaging apparatus the whole RF coil system is mounted on a tubular former (not shown) and the part of a patient to be examined is inserted via one end of the former, the former being positioned within the first coil system 1, 3, 5, 7 ready to receive the patient to be examined.

In the apparatus being described by way of example the coil arrangement comprising coils 9A and 9B is mounted on a tubular former (not shown) positioned within the first coil system, as in conventional apparatus, and the coil arrangement comprising coils 10A and 10B is adapted to be positioned closely around the head of a patient.

Figure 3:
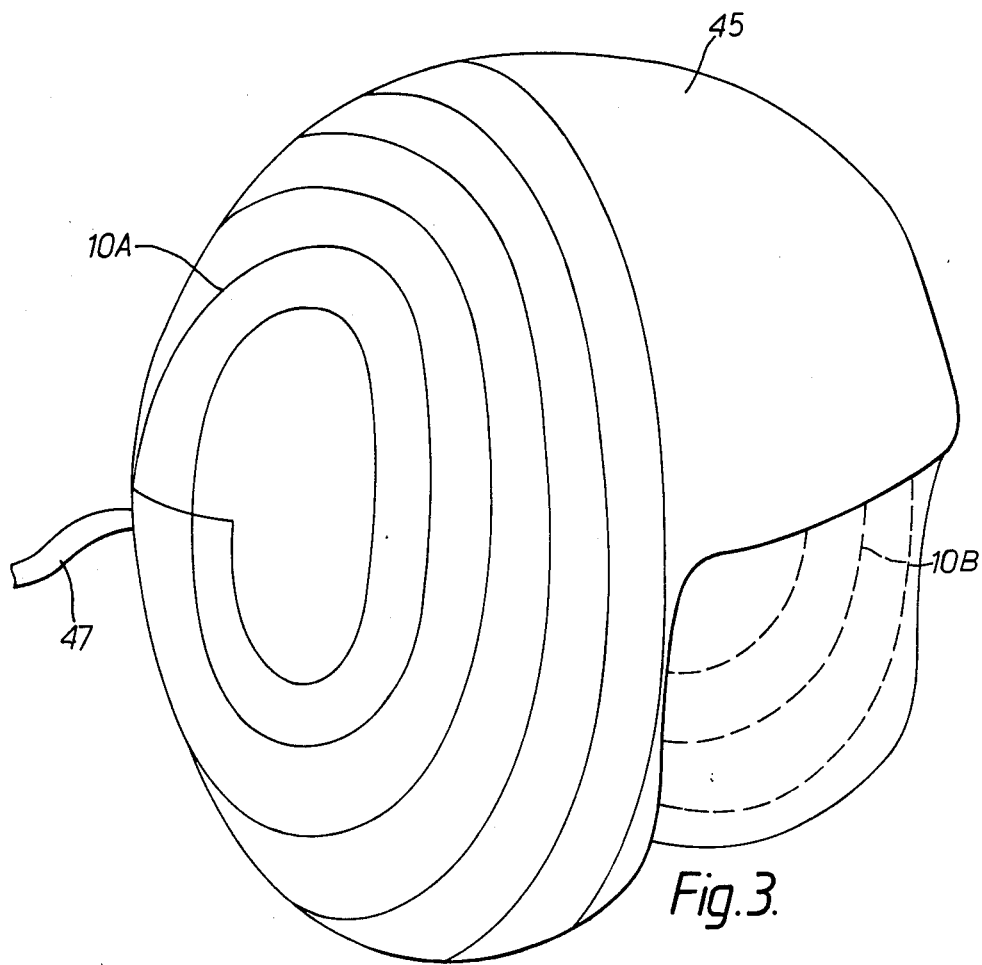
FIG. 3 is a diagram illustrating the construction of a coil arrangement.

Referring now to FIG. 3, to this end the coil arrangement comprises a former 45 which is of part-spherical external shape and to all intents and purposes has the external appearance of an open-face crash helmet as is commonly used by motorcycle riders. The two coils are disposed coaxially, one on either side of the former, and each comprises a number of turns, typically from three to six, wound in a spiral conforming to the external surface of the former.

Figure 4:
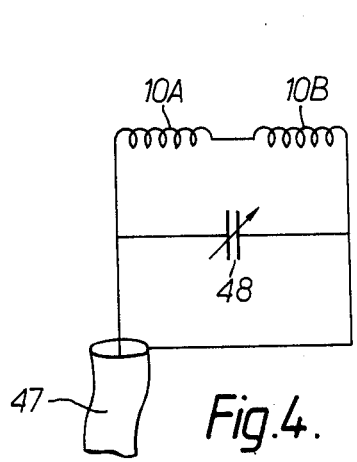
FIG. 4 is a circuit diagram showing a suitable method of connection of the coils of the arrangement.

The two coils are provided with a common lead 47 in the form of a balanced feeder and are suitably connected to the feeder in series and tuned by a capacitor 48 as illustrated in FIG. 4. Alternatively the coils may be connected in parallel.

Figure 5:
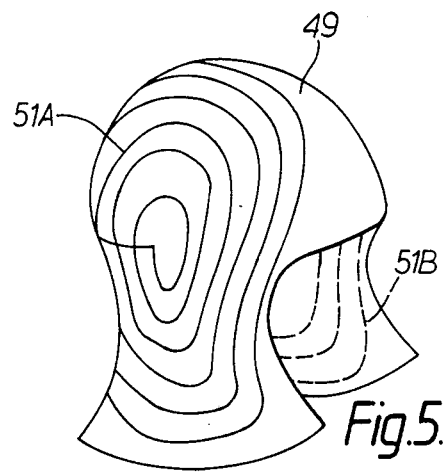
FIG. 5 is a diagram illustrating an alternative form of the coil arrangement.

Referring now to FIG. 5, in an alternative arrangement, the former 49 has an out-turned skirt around its lower edge thus providing a necked region between the skirt and the main body of the former and the turns of each of the coils 51A and 51B are of elliptical, rather than circular shape, and extend over the necked region and the skirt, as well as the main body portion.

It will be appreciated that many other variations of coil shape and configuration are possible within the broad concept of the present invention.

Whilst in the embodiments described above by way of example the formers 45 and 49 are made in one piece, in other embodiments of the invention the former may be made in two parts adapted for assembly around the part of a patient to be examined.

Such an arrangement forms the subject of U.S. patent application No. 635,417 filed on the July 30, 1984, in the name of David John Gilderdale.

It will be understood that whilst in the apparatus described above by way of example the coil arrangement in accordance with the invention is used only for sensing RF fields, a coil arrangement in accordance with the invention may in other apparatus be used alternatively or additionally for applying RF fields.

By virtue of their curvature the coils of a coil arrangement in accordance with the invention are adapted to more closely surround bodies having the sorts of shapes typically encountered in the examination of patients than are the coils of a conventional tubular coil arrangement. Hence, when used for sensing RF fields during the examination of a part of a body of a patient, a coil arrangement in accordance with the invention is often capable of greater sensitivity than a comparable conventional tubular coil arrangement. Similarly, when used for applying RF fields, a coil arrangement in accordance with the invention is often capable, more especially when disposed on a spherical surface, of providing a stronger field of greater homogeneity in a part of a body of a patient under examination than a comparable conventional tubular coil arrangement.

I claim:

1. A nuclear magnetic resonance imaging apparatus comprising:
    (a) circuitry for producing and detecting radio frequency signals;
    (b) coil structure coupled to said circuitry for application of radio frequency magnetic fields to, and the sensing of radio frequency magnetic fields in, a body by means of said apparatus, said coil structure comprising;
    (c) a former having convexly curved shape for facilitating close fitting around a correspondingly shaped part of said body said coil structure including at least one coil having a plurality of elliptical turns of different sizes which collectively conform to and are supported on a convexly curved portion of said former.

2. A nuclear magnetic resonance imaging apparatus comprising:
    (a) circuitry for producing and detecting radio frequency signals;
    (b) coil structure coupled to said circuitry for the application of radio frequency magnetic fields to, and sensing of radio frequency magnetic fields in a body under examination by means of said apparatus, said coil structure comprising a former having a convexly curved shape similar to that of an open faced crash helmet for facilitating close fitting around a human head, at least one portion of said coil structure including a plurality of turns of different sizes which together conform to and are supported on a curved portion of said former.

3. The apparatus of claim 2, wherein: each said coil comprises a plurality of turns connected in series.

4. The apparatus of claim 2, wherein: said coil former is in a configuration of a helmet having an out-turned skirt around its lower edge.

5. The apparatus of claim 4, wherein: between said skirt and the main body of the former there is a necked region and each said coil extends over the main body of the former, the necked region and said skirt.

6. A nuclear magnetic resonance imaging apparatus comprising circuitry for generating and detecting radio frequency magnetic signals and coil structure coupled to said circuitry and arranged for the application of radio frequency magnetic fields to, and sensing of radio frequency magnetic fields in, a body under examination by means of said apparatus, said coil structure comprising a former defining a shape which is curved about more than one axis and configured to facilitate close fitting around a human head, said coil structure including a plurality of turns of different sizes, one inside the other, which together conform to and are supported on said curved surface of said former.

7. The apparatus of claim 6, wherein said coil structure comprises two coils disposed on said former for facilitating fitting of said coils and former around a human head with one coil on each side of the head, said two coils being in substantially coaxial alignment.

8. The apparatus of claim 7, wherein said two coaxially aligned coils are connected electrically in series.

9. The apparatus of claim 8, wherein each of said two coils comprises turns forming a spiral configuration.

10. A nuclear magnetic resonance imaging system comprising:
(a) means for subjecting a body to be imaged to a steady uniform magnetic field;
(b) means for applying a radio frequency magnetic field to said body in the presence of said steady magnetic field to excite magnetic resonance in said body;
(c) means for sensing a radio frequency magnetic field resulting from magnetic resonance excited in said body;
(d) means for utilizing signals produced by said means for sensing to produce an image of said body;
(e) at least one of said application and sensing means including a coil structure, said coil structure comprising a former defining a shape which is curved about more than one axis and configured to facilitate close fitting around a correspondingly shaped portion of said body, and including a plurality of turns of different sizes, one inside the other, which together conform to and are supported on said curved surface of said former.

* * * * *